United States Patent
Tschanz et al.

(10) Patent No.: US 10,108,751 B2
(45) Date of Patent: Oct. 23, 2018

(54) ITERATIVE PACKING OPTIMIZATION

(71) Applicant: Disney Enterprises, Inc., Burbank, CA (US)

(72) Inventors: Michael Tschanz, Orlando, FL (US); Patrick McNaull, Winter Garden, FL (US); Bryant Boyle, Winter Garden, FL (US); J. Thomas Ngo, Pasadena, CA (US)

(73) Assignee: Disney Enterprises, Inc., Burbank, CA (US)

( * ) Notice: Subject to any disclaimer, the term of this patent is extended or adjusted under 35 U.S.C. 154(b) by 842 days.

(21) Appl. No.: 14/453,758

(22) Filed: Aug. 7, 2014

(65) Prior Publication Data
US 2014/0350898 A1 Nov. 27, 2014

Related U.S. Application Data

(62) Division of application No. 13/457,229, filed on Apr. 26, 2012, now Pat. No. 8,868,230.

(51) Int. Cl.
*G06F 17/50* (2006.01)
*B33Y 50/00* (2015.01)
(Continued)

(52) U.S. Cl.
CPC ............ *G06F 17/50* (2013.01); *B29C 64/386* (2017.08); *B33Y 50/00* (2014.12);
(Continued)

(58) Field of Classification Search
None
See application file for complete search history.

(56) References Cited

U.S. PATENT DOCUMENTS 5,363,313 A 11/1994 Lee
5,430,831 A 7/1995 Snellen
(Continued)

FOREIGN PATENT DOCUMENTS

JP 6372526 A 4/1988
JP 06-142725 A 5/1994
(Continued)

OTHER PUBLICATIONS

Bouganis A Vision-Based Intelligent System for Packing 2-D Irregular Shapes IEEE Transactions on Automation Science and Engineering, vol. 4, No. 3, Jul. 2007.*
(Continued)

*Primary Examiner* — Omar F Fernandez Rivas
*Assistant Examiner* — Cuong V Luu
(74) *Attorney, Agent, or Firm* — Dorsey & Whitney LLP

(57) ABSTRACT

An iterative method and system for performing the method are described that implement a technique to fit irregularly shaped items into a defined space. In particular, one example may take the form of a method including predetermining one or more layouts for a defined space. Each layout has a plurality of shapes. The method also includes receiving a set having a plurality of items and determining one or more configurations formed by assigning to each shape in the layout an item from the set. The items match the shapes to which they are assigned. Additionally, the method includes scoring each configuration and selecting one configuration based at least in part upon the scoring.

23 Claims, 7 Drawing Sheets

(51) Int. Cl.
*G05B 19/4097* (2006.01)
*B29C 64/386* (2017.01)

(52) U.S. Cl.
CPC .......... *G05B 19/4097* (2013.01); *G05B 2219/35162* (2013.01); *G05B 2219/49023* (2013.01)

(56) References Cited

U.S. PATENT DOCUMENTS

| | | | |
|---|---|---|---|
| 5,501,571 A | 3/1996 | Van Durrett et al. | |
| 5,720,157 A | 2/1998 | Ross | |
| 5,748,762 A | 5/1998 | Guez | |
| 5,815,398 A * | 9/1998 | Dighe | G06Q 10/043 700/171 |
| 5,844,807 A | 12/1998 | Anderson et al. | |
| 6,487,544 B1 * | 11/2002 | Eshelman | G06N 3/126 706/13 |
| 6,665,732 B1 * | 12/2003 | Garofalakis | H04L 29/06 709/231 |
| 6,721,762 B1 * | 4/2004 | Levine | G06Q 10/04 |
| 6,876,958 B1 | 4/2005 | Chowdhury et al. | |
| 6,937,992 B1 | 8/2005 | Benda et al. | |
| 6,980,934 B1 * | 12/2005 | Sadovnik | G06F 17/5004 206/505 |
| 7,366,643 B2 * | 4/2008 | Verdura | G06F 17/50 53/452 |
| 7,743,322 B2 * | 6/2010 | Atkins | G06T 11/60 715/243 |
| 7,788,579 B2 | 8/2010 | Berkner et al. | |
| 8,952,284 B1 * | 2/2015 | Wong | B07C 5/3412 209/586 |
| 2003/0095145 A1 | 5/2003 | Patrizio et al. | |
| 2003/0191608 A1 * | 10/2003 | Anderson | G06F 11/328 702/189 |
| 2005/0102617 A1 * | 5/2005 | Nagahara | G06F 17/211 715/249 |
| 2006/0150092 A1 * | 7/2006 | Atkins | G06Q 10/043 715/251 |
| 2006/0271847 A1 * | 11/2006 | Meunier | G06K 9/00469 715/205 |
| 2008/0244490 A1 * | 10/2008 | Nakatake | G06F 17/5072 716/124 |
| 2008/0256439 A1 * | 10/2008 | Boreham | G06F 17/211 715/246 |
| 2009/0002764 A1 * | 1/2009 | Atkins | G06T 11/60 358/1.18 |
| 2009/0037011 A1 * | 2/2009 | Spiridonov | G06F 7/00 700/98 |
| 2009/0216364 A1 * | 8/2009 | Grissom | G06Q 10/087 700/214 |
| 2009/0299790 A1 | 12/2009 | Devarajan et al. | |
| 2010/0095204 A1 * | 4/2010 | Kobayashi | G06F 17/211 715/700 |
| 2010/0178149 A1 | 7/2010 | Fritzsche | |
| 2010/0256790 A1 * | 10/2010 | Teran-Matus | G06F 17/50 700/98 |
| 2010/0269037 A1 * | 10/2010 | Atkins | G09G 5/14 715/244 |
| 2010/0321391 A1 * | 12/2010 | Rubin | G06T 11/206 345/441 |
| 2013/0024757 A1 * | 1/2013 | Doll | G06F 17/212 715/204 |
| 2013/0088517 A1 * | 4/2013 | McKenna | G06F 17/30274 345/635 |
| 2013/0132042 A1 * | 5/2013 | Chan | G06F 17/50 703/1 |
| 2013/0144910 A1 * | 6/2013 | Cardno | G06F 17/30572 707/780 |
| 2013/0290220 A1 | 10/2013 | Tschanz et al. | |
| 2013/0304604 A1 * | 11/2013 | Hoffman | G06Q 30/0621 705/26.5 |

FOREIGN PATENT DOCUMENTS

| | | |
|---|---|---|
| JP | 07-096311 | 4/1995 |
| JP | 11-039358 | 2/1999 |
| JP | 11-066123 | 3/1999 |
| JP | 2000-158301 | 6/2000 |
| JP | 2001236340 A | 8/2001 |
| JP | 2003-256011 | 9/2003 |

OTHER PUBLICATIONS

Cagan Shape Annealing Solution to the Constrained Geometric Knapsack Problem Department of Mechanical Engineering, Carnegie Melon University, Nov. 2, 1992.*
Halavati et al., "Optimizing Allocation of Two Dimensional Irregular Shapes Using an Agent Based Approach", World Academy of Science, Engineering and Technology (2005) 11, 73-76.
Ngo, "Techniques for Processing Reconstructed Three-Dimensional Image Data", Specification for U.S. Patent Application, Disney Ref. No. 11-DIS-274, (2006), 34 pages.
Xu et al., "Ant Colony Algorithm for the Weighted Item Layout Optimization Problem", Institute of Intelligent Vision and Image Information, China Three Gorges University, China (Feb. 2011), http://arxiv.org/ftp/arxiv/papers/1001/ 100.4099.pdf, 18 pages.
Gogate, et al., "Intelligent Layout Planning for Rapid Prototyping", International Journal of Production Research, vol. 46, No. 20, pp. 5607-5631, XP055381902, GB, ISSN: 0020-7543, DOI: 10.1080/00207540701277002, Oct. 15, 2008, 26 Pages.
Wodziak, et al., "A Genetic Algorithm for Optimizing Multiple Part Placement to Reduce Build Time", XP055381913, Clemson University, Clemson SC 29634, https://www.researchgate.net/publication/264873211_A_genetic_algorithm_for_optimizing_multiple_part_placement_to_reduce_build_time/links/5565dfbd08aefcb861d19140.pdf [retrieved on Jun. 15, 2017], Jan. 1, 1994, 13 Pages.
Nyaluke, et al., "Rapid Prototyping Work Space Optimization", Computers & Industrial Engineering, vol. 31, No. 1-2, pp. 103-106, XP055381906, ISSN: 0360-8352, DOI: 10.1016/0360-8352(96)00202-1, Oct. 1, 1996, 4 Pages.

* cited by examiner

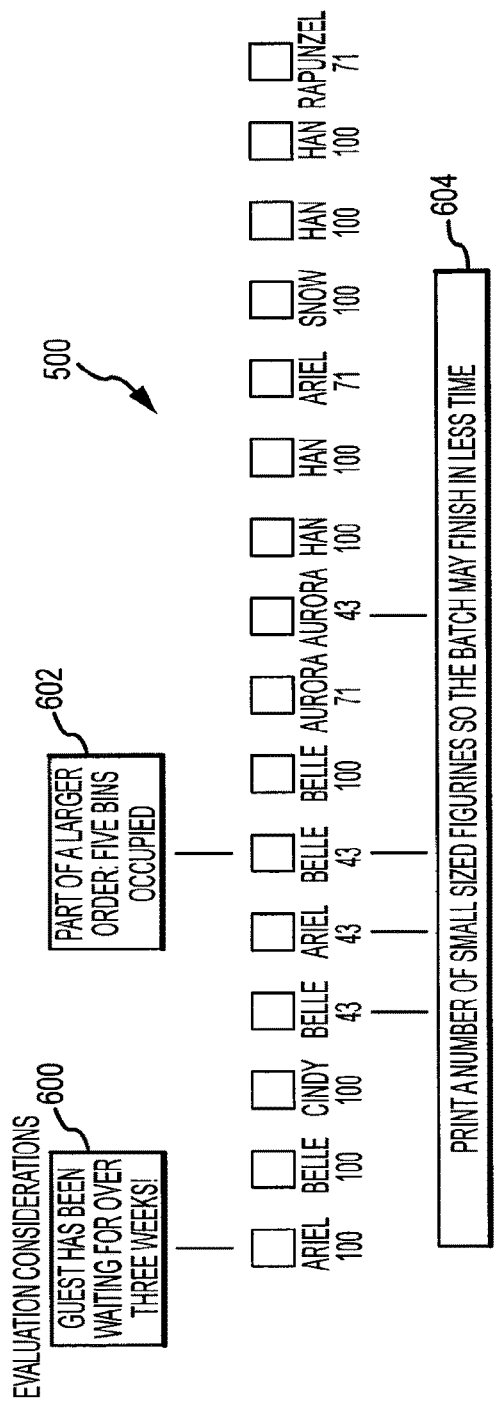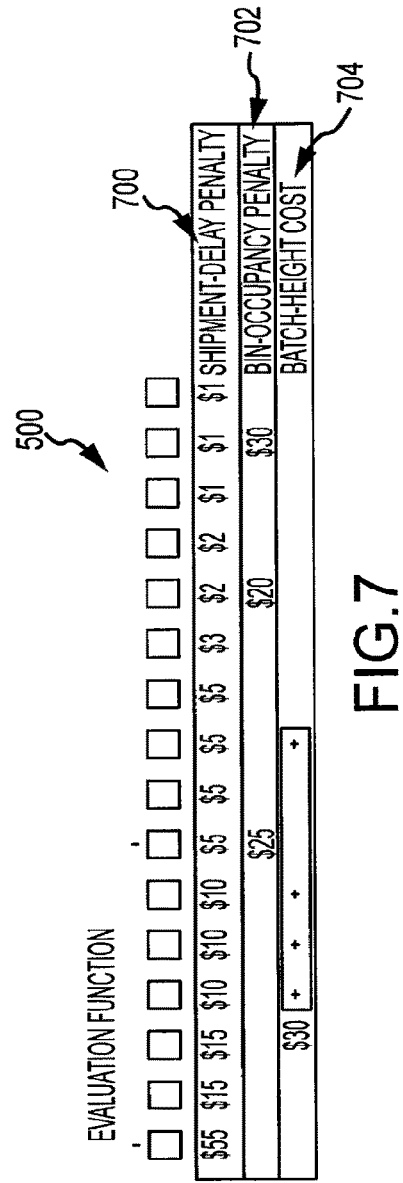
FIG. 6
FIG. 7

ITERATIVE PACKING OPTIMIZATION

CROSS-REFERENCE TO RELATED APPLICATIONS

This application is a divisional of U.S. patent application Ser. No. 13/457,229, entitled "Iterative Packing Optimization," filed on filed Apr. 26, 2012, now U.S. Pat. No. 8,868,230, which is incorporated by reference in its entirety as if fully disclosed herein.

TECHNICAL FIELD

The present discussion relates generally to a system and methods for packing objects into a defined volume, and more particularly to fitting items having a complex or irregular geometry into a defined volume for a three-dimensional (3-D) printing operation.

BACKGROUND

Efficient use of space while packing objects into a defined space is valuable in a variety of applications. When objects are not efficiently and/or properly positioned relative to each other and within the space fewer items may fit. In some cases, the inefficient use of space may be costly. For example, printer beds used in 3-D printing processes may have a pre-determined volume into which objects to be printed fit. Inefficient use of space within the print bed may result in multiple additional printing runs as well as delays in the printing of objects.

Generally, square or rectangular objects are relatively easy to pack into square or rectangular defined spaces. Efficiently packing irregularly shaped objects however is more challenging. Conventionally, human operators have been tasked with trying to best fit objects into defined spaces. In the case of irregularly shaped objects the operator may be able to achieve a certain level of packing efficiency, but this may be limited by the operator's memory, creativity and ambition to improve layouts of objects within the defined spaces. Typically, the operator will memorize a few favorite patterns and reuse those patterns over and over again. The operator's knowledge is generally not shared across platforms or printing consoles, resulting in a loss of global knowledge. The challenge of efficiently packing irregularly shaped items becomes even more difficult when the irregularly shaped items are randomly provided and have varying sizes as well as shapes.

SUMMARY

An iterative method and system for performing the method are described that implement a morphological technique to fit irregularly shaped items into a defined space. In particular, one example may take the form of a method including predetermining one or more layouts for a defined space. Each layout has a plurality of shapes. The method also includes receiving a set having a plurality of items and determining one or more configurations formed by assigning to each shape in the layout an item from the set. The items match the shapes to which they are assigned. Additionally, the method includes scoring each configuration and selecting one configuration based at least in part upon the scoring.

Another example may take the form of a method of placing in a defined space, the method including predetermining one or more packing layouts for the defined space with each layout having a plurality of shapes. The method includes maintaining a queue having an order of irregularly shaped items in a computer readable medium, each of the irregularly shaped items having at least one assigned characteristic. Additionally, the method includes determining at least two configurations according to a selected metric using a processor and determining a relative rank of at least two of the configurations. Further the method includes selecting, at least in part based on the determined rank, a configuration. The configuration corresponds to a print bed for 3-D printing a subset of the irregularly shaped items in the queue.

Yet another example may take the form of a method including generating, using a processor, a plurality of layouts to fit a plurality of shapes in a defined space and receiving a set of irregularly shaped items. Also, the method includes generating a plurality of configurations by correlating a subset of irregularly shaped items from the set with the plurality of layouts and selecting one of the plurality of configurations. The method additionally includes generating a batch of irregularly shaped items by a 3-D printing process using the selected configuration and updating the set by removing irregularly shaped items generated in the batch from the set.

Still another example may take the form of a method including pre-computing at least one layout having a plurality of holes positioned within a defined space using a morphological technique and receiving a queue of irregularly shaped items. The queue is stored in a computer readable medium and each of the irregularly shaped items corresponds to at least one of the plurality of holes. The method also includes iteratively determining a plurality of configurations fitting a subset of the queue into the defined space wherein each configuration comprises a different subset of the queue of irregularly shaped items. Further, the method includes scoring each of the plurality of configurations and selecting one of the plurality of configurations based at least in part upon the scoring of the plurality of configurations.

Still yet another example may take the form of a system having a computer storage device configured to store a set containing a plurality of irregularly shaped items to be printed and a processor in communication with the computer storage device. The processor is configured to predetermine one or more layouts for a defined space and each layout has a plurality of shapes. The processor also receives the set of the plurality of items and determines one or more configurations formed by assigning to each shape in the layout an item from the set, the item matching the shape. The processor further scores each configuration and selects one configuration based at least in part upon the scoring.

While multiple examples are disclosed, still other examples of the present invention will become apparent to those skilled in the art from the following Detailed Description. As will be realized, the examples are capable of modifications in various aspects, all without departing from the spirit and scope of the examples. Accordingly, the drawings and detailed description are to be regarded as illustrative in nature and not restrictive.

BRIEF DESCRIPTION OF THE DRAWINGS

FIG. 6 illustrates the print queue of FIG. 5 including item selection considerations.

FIG. 7 illustrates the print queue of FIG. 5 including cost evaluation factors.

DETAILED DESCRIPTION

Figure 1:
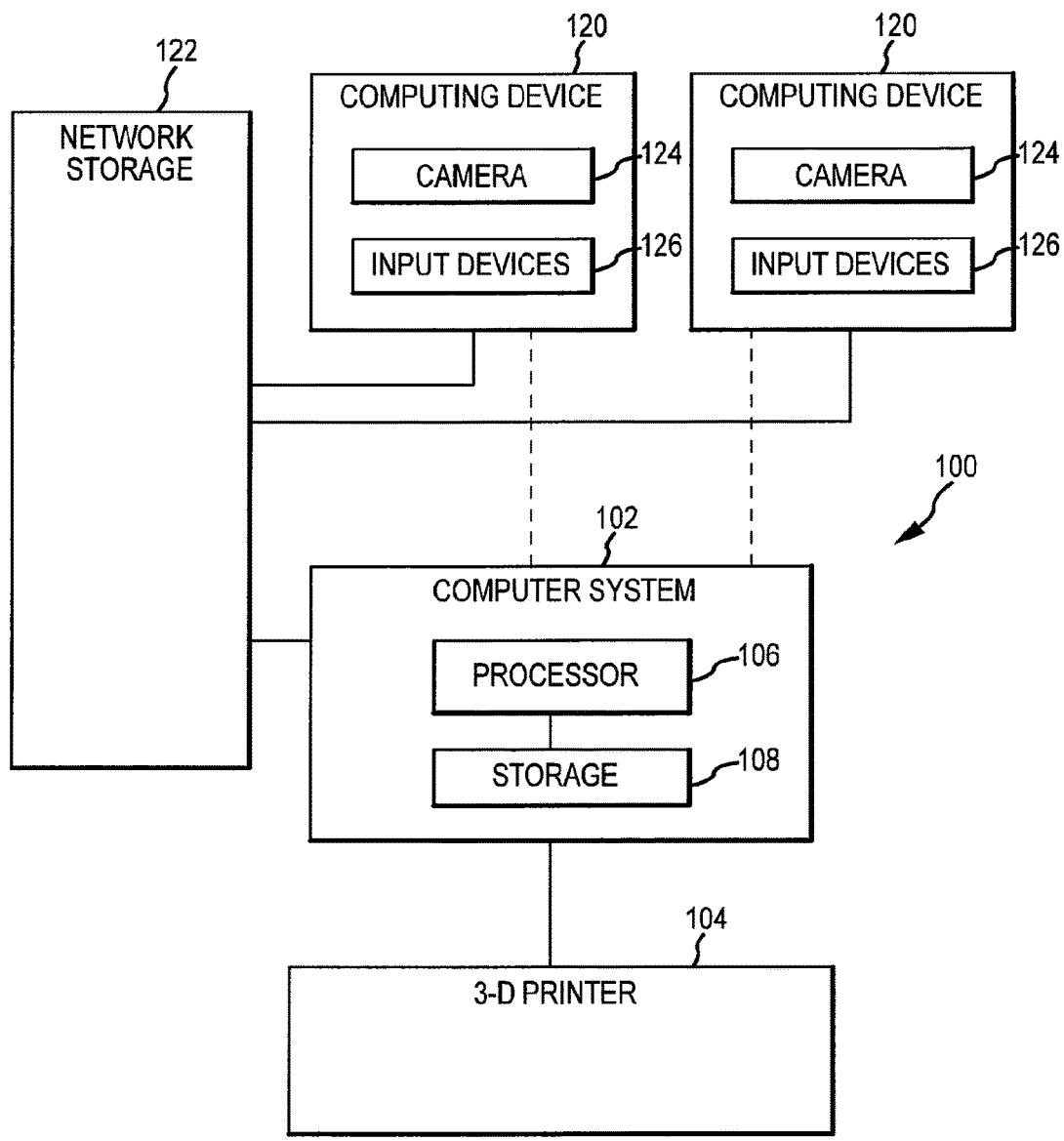
FIG. 1 illustrates a system for generating mass customizable objects.

A system and methods for positioning irregularly shaped objects within a defined space are described. The system may take the form of a computing system that pre-computes a plurality of densely packed layouts for the defined space. Each layout includes a plurality of shapes. The system receives a set of items and determines a plurality of configurations by assigning items from the set to a layout, the assigned items matching a shape in the layout. The system scores each configuration and selects one configuration based upon the scoring. Generally, the pre-computing step may include creating layouts based solely on the shapes that are to be used in a configuration and the created layouts may populate a library of layouts.

As used herein, the term "layout" may refer to an organization of shapes that fit within the defined space. The term "configuration" may refer to a layout that has been populated by items from the set. The term "set" may generally refer to one or more items provided to the computing system for pairing with a layout to create a configuration. The set may take any suitable form including a queue, a linear queue, a priority queue, a "bag", and so forth. A bag may be a collection with multiple duplicate items (e.g., identical instances of the same items). The set may be ordered in any suitable manner and, in some embodiments, the set order may be utilized in the scoring. For example, the set may take the form of a priority queue having a tree data structure where a root item is the best scoring item and all other items (i.e., children) may be in any order and have any scoring. Additionally, it should be appreciated that the defined space may take the form of a two-dimensional space or a three-dimensional space.

In some embodiments, the system may be configured to receive human input for layouts and/or configurations. That is, the system may be configured to receive operator input related to layouts and configurations that the operator has created. The use of operator experience and expertise may help the system to start with better initial layouts and further may help the system to converge more quickly towards optimization.

In some embodiments, the system may include a graphical user interface that allows an operator to prepare a layout using defined shapes or defining new shapes. The shapes may include both irregularly shaped items and regularly shaped items (e.g., rectangular, square, cubical, spherical and so forth). In some embodiments, the items may be selected or created by the operator and "dragged and dropped" into a defined space. Further, the operator may reorient the items within the space to achieve a desired density of items within the defined space.

The system may further be configured to obtain an image of an item to be fit within the defined space and create a binary image of the item. In some cases, the items may include both regularly shaped items and irregularly shaped items. The system may utilize the binary image to morphologically position the item within the defined space to create a layout and the layout may be paired with an item from the set to create a configuration. In one example, the computing system may be utilized in combination with a 3-D printing machine to mass create custom or semi-custom objects. For example, in one example the system may print custom figurines each having unique characteristics and/or unique sizes. In other examples, the figurines may be created in determined sizes and/or with semi-customizable shapes.

The computer system may utilize morphological techniques to position the figurines within a print bed for the 3-D printing. The morphological techniques may include obtaining an image of the figurines and converting the image to a binary image. That is, the image may be converted to a black and white silhouette of the figurine. The computer system utilizes the binary images of multiple objects for positioning the figurines and/or other objects within the print bed. In other embodiments, the computer system may be configured to obtain a 3-D image of the object represented by a point cloud. The point cloud may be collapsed into a plane and the boundary of the planar point cloud is determined. It should be appreciated that the point cloud may be collapsed in a number of different directions or orientations to obtain different planar representations of the point cloud. In still other embodiments, edge detection software may be implemented to determine an outer boundary of the figurines.

In some examples, the computer system may receive or generate a queue of items for printing. The queue may generally be organized chronologically based upon a time of entry into the queue. The queue may include thumbnail images of the items for printing and may be scrollable and dynamic. That is, items may be added to and removed from the queue. The computer system may remove items from the queue once items in the queue are printed. Items may be selected for printing based at least in part upon the order in which the items were placed in the queue. Additionally, items may be selected for printing based at least in part upon other criteria. In particular, items may be selected for printing based upon how the items in the queue fit together within a particular print box configuration. For example, if the second and fifth items in the queue fit into the print bed better than the first, third and fourth items, the second and fifth items may be selected for printing first.

The computer system may further be configured to determine which items in the queue to print based on a scoring process performed on various print bed configurations. As may be appreciated, multiple print bed configurations may be prepared based upon the items in the queue for printing. The configurations may each be arranged in accordance with the morphological techniques used to densely pack layouts with the figurines within the print beds. The scoring may take into account a cost of printing figurines using a particular print bed. For example, the scoring may include a cost for using each of the print beds (e.g., cost for printing the beds based on a height of the figurines in the print bed), and a cost for not printing figurines that will remain in the queue. Thus, given an order queue line and a number of configurations, a particular configuration is selected which minimizes the cost function based on queue delays, printing time and total number of figurines in a configuration.

The computer system may store layouts of print beds that have been organized using the morphological techniques. Additionally, the computer system may implement a genetic technique to maintain layouts that either are frequently utilized or score higher than other layouts. Better layouts are promoted and configurations having better packing are passed along. Thus, a library of layouts that are better optimized for the queue may be maintained. The genetic algorithm is an evolutionary-style routine where the best members survive in an iterative procedure to "pass on" the best overall traits from one iteration to the next. Thus, a well-packed space may then be used as a sub-assembly for improvement for future iterations, resulting in increasingly higher area utilization over time without the need for human intervention.

Additionally, in some examples, historical queue data may be utilized to predict which layouts may be beneficial in the future. The historical data may further be used with the morphological techniques to help prepare alternative layouts other than those which have already been prepared. Layouts may be designed based on historical data to accommodate a relative frequency of items requested to be printed. For example, if a first item has historically been requested more than a second item, layouts may be designed to accommodate more of the first item than the second item. A specific example may be if a 7" Belle figurine is ordered in a 5:1 ratio to 3" Belle figurines, but the library of configurations only contains these figurines in a 3:1 ratio, a new configuration could be generated using the 5:1 ratio, thus helping to process the order queue in a more effective and timely manner. It should be appreciated that historical metrics other than a ratio between two items may be utilized to help formulate configurations that more effectively process the queue. Additionally, the historical data may be utilized in combination with configuration scoring (e.g., height cost) to provide more effective layouts. That is, the metrics may be utilized to design layouts that achieve higher scores relative to historically used layouts.

The utilization of the morphological techniques may beneficially allow for higher density packing of irregular shaped objects into defined spaces. As may be appreciated, the techniques may be implemented in a variety of different fields to achieve one or more desired goals. In 3-D printing, for example, more densely packed print beds may reduce the number of printing runs and allow for more items to be printed in less time. Additionally, the morphological techniques fits items into the defined space in a manner that takes advantage of the available space and the genetic algorithm manages layouts that have proven efficient in view of the variability of the items that appear in the queue. Prior techniques relied on humans to orient objects within the print beds which generally limited the variety of layouts created and/or utilized.

In one example, the system and methods may be implemented as part of a mass customizable production system. The mass customizable production system may allow for a consumer or guest to the select a particular figurine (e.g., a princess or action hero) and customize the figurine by selecting the size and color of the figurine. Further, face and/or other portions of the figurine may be customized to imitate the customer's features. That is, the system may be configured to capture an image of the customer and the image may be processed such that a 3-D model of the face may be reconstructed on the figurine. This process is described in greater detail in related U.S. patent application Ser. No. 13/474,625, titled "Techniques for Processing Reconstructed Three-Dimensional Image," filed May 17, 2012, which is incorporated herein by reference in its entirety and for all purposes.

As may be appreciated, in such a system, there will be a large variety in the items to be printed or otherwise produced, and the queue may be ever changing, but there may also be high expectations on the part of the customers for timely delivery of the figurines. The efficient packing of the figurines therefore becomes both more difficult due to the randomness of the customer orders, but also relates to an ability to meet the customer's expectations with regard to timeliness. That is, as there is generally expected to be a demand for the figurines, more efficient packing of the figurines into print beds results in faster turn-around of all customer orders, thereby meeting or exceeding customer's expectations as to timeliness.

It should be appreciated that although the techniques and systems discussed herein are expected to be implemented in certain specific applications described as examples herein, the scope of the present disclosure should not be construed as being limited to the specific examples. Rather the examples are presented as non-limiting examples.

Turning to the drawings and referring initially to FIG. 1, a manufacturing system 100 is illustrated. The manufacturing system 100 may include a central computer 102 and a printer 104 coupled to the computer 102. The central computer 102 may include a processor 106 and a storage device 108. The computer 102 may be configured to prepare layouts for fitting irregularly shaped objects (e.g., non-square or non-rectangular objects) into defined spaces in accordance with the techniques discussed herein. The storage device 108 is in communication with the processor 104 and may be configured to store the layouts.

The printer 104 is in communication with the computer system 102 and is configured to print the irregularly shaped items in accordance with information received from the computer system 102. The printer 104 may be a 3-D printer and may take any suitable form. 3-D printing is sometimes referred to additive manufacturing and includes techniques for creating 3-D objects by laying down successive layers of material. Typically, a digital image, such as a computer aided drafting (CAD) drawing, of an object is read into a 3-D printer and the printer lays down successive layers of liquid, powder, or sheet material to build up the object from a series of cross sections. The layers are joined together to create the final shape. For the present purposes, any suitable 3-D printing technology may be implemented, such as selective laser sintering, direct metal laser sintering, fused deposition modeling, stereo lithography, laminated object manufacturing, electron beam melting, plaster based 3-D printing, and so forth.

The manufacturing system 100 may further include a plurality of distributed computing devices 120 and a network accessible storage 122. The distributed computer devices 120 may each be configured to receive or capture input and provide the input to the computer system 102 and/or the network accessible storage 122. For example, the computing devices 120 may each include a digital camera 124 configured to capture an image and provide the image to the computer system 102 and/or the network accessible storage 122. Additionally, the computing devices 120 may include other input devices 126, such as a mouse and a keyboard, for entering information such as user data and/or order information The network accessible storage 122 may take any suitable form including but not limited to server storage on a local network, cloud storage accessible via the Internet, or the like. The network accessible storage 122 may serve as a common repository which could be a database accessible by each component of the system. It should be appreciated that in some examples, the network accessible storage 122 may be co-located with the computer system 102 or one of the distributed computing devices 120. In other examples, the system 100 may not include the network accessible storage.

In some examples, an additional computing device (not shown) may be included in the system 100 to provide additional computing power. The additional computing device may generally be configured to perform computing tasks offline. Additionally, an operator console (not shown) may be provided within the system to provide access to information for the purposes of tracking and/or intervention.

Figure 2:
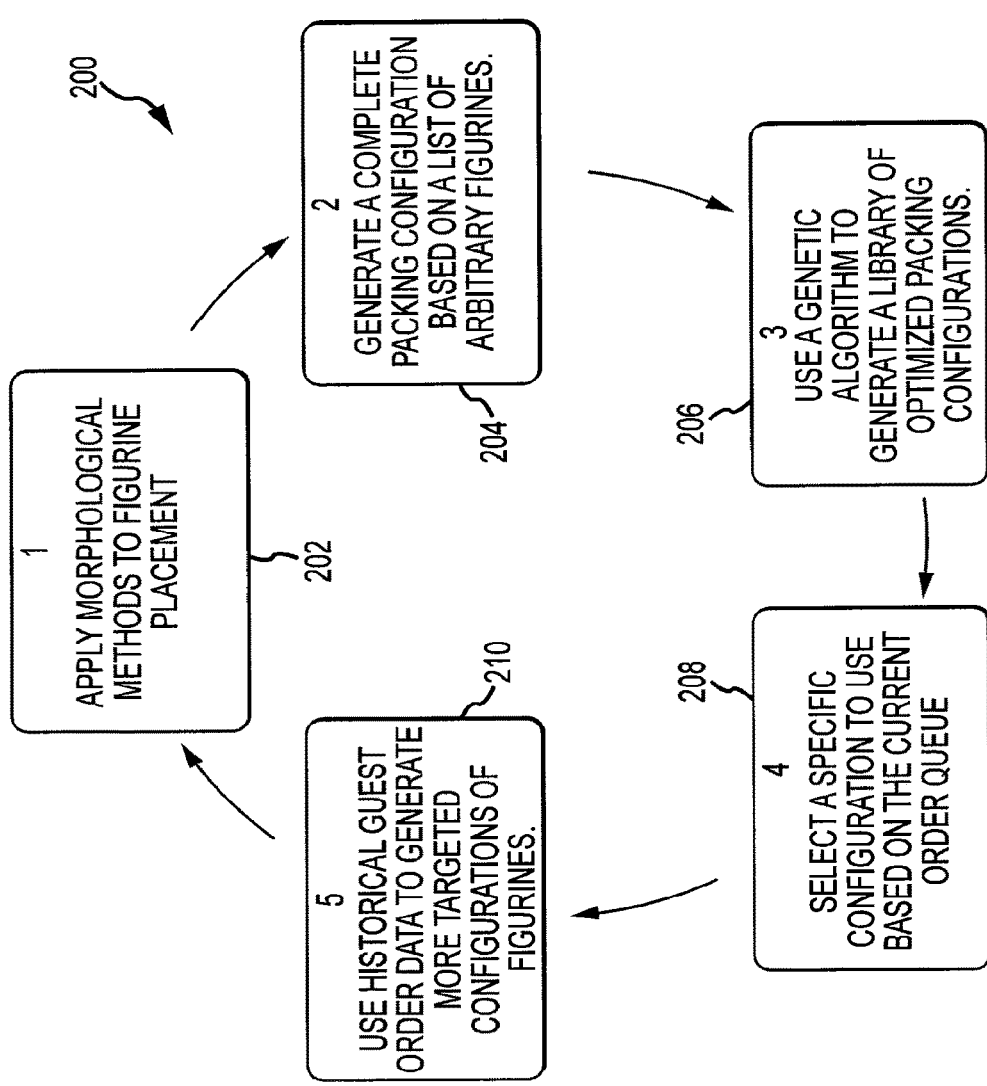
FIG. 2 illustrates a workflow for efficiently fitting irregularly shaped objects within a defined space.

Turning to FIG. 2, the processes performed by the system 100 are illustrated as an iterative workflow 200. That is, the processes may generally be repeated in an iterative manner to help refine the process and continually improve the created layouts and the configurations used. Initially, a morphological algorithm may be applied to determine placement of the objects within the defined space (Block 202). That is one or more layouts may be created. The layouts each have a plurality of holes into which corresponding items may fit. A listing of items to be placed within the defined space may be used to generate a complete packing layout (Block 204). As used herein the terms "place", "placing", "placed" and the like may refer to both orientation and positioning within the defined space. In one example, a number of different configurations may be generated based on the queue listing the items to be positioned within the defined space and correlating the items of the queue with holes in the layouts. A genetic algorithm is implemented to generate a library of packing configurations (Block 206). Generally, the genetic algorithm is implemented to help maintain those layouts that are efficient for packing particular items and for removing those layouts that are less efficient. Subsets of efficient layouts may also be combined to yield increasingly more efficient layouts. This may be achieved through a scoring technique discussed in better detail below.

A configuration is selected based on its efficiency relative to the current queue (Block 208). That is, a specific configuration is selected which achieves or best meets predetermined criteria. In some cases, the configuration may include items from the queue in a non-linear manner. That is, the configuration may not include items based solely on their order in the queue. Items included in the configuration may be removed from the queue once the configuration is selected.

Historical data may then be used to generate more targeted layouts (Block 210). In particular, where items generally have a standard shape or size and/or are semi-customizable, historical data may be evaluated to determine trends that may be beneficially utilized to forecast future demand. The forecasted demand may, in turn be utilized to determine configurations that may effectively meet future demand.

The workflow 200 is repeated in an iterative manner which helps to both meet current demands based on items in the queue through the morphological algorithm (Block 202) and to refine the layouts previously used by continuously updating the library through the genetic algorithm (Block 206). The genetic algorithm may implement artificial intelligence techniques to help evolve the library of the configurations towards optimization. Generally, in a first iteration, a set of layouts are evaluated based on how well the layouts meets criteria for printing items from the queue efficiently. The set of layouts may be changed though modification of the layouts by taking portions of higher ranking layouts and including them in lower ranking layouts, addition of new layouts from the morphological techniques, and/or through a random modification of the layouts. As such, a new set of layouts is created through each iteration and the set of layouts is progressively improved to meet the demands of the queue.

The morphological algorithm may generally be concerned with achieving a particular packing metric. In some case, the metric may relate to a densely populated space. That is, for example, the morphological algorithm may be configured to fit as many irregularly shaped objects from the queue into the print bed for each printing run. As the queue may generally include a random assortment of the irregularly shaped items there may be a variety of different possible layouts that achieve a relatively dense packing. Accordingly, the morphological algorithm may be configured to produce a number of layouts that meet the printing demands set forth by the queue. In other embodiments, other metrics may be used, such as a minimum number of items in the defined space, a cost to print, and so forth.

Figure 3:
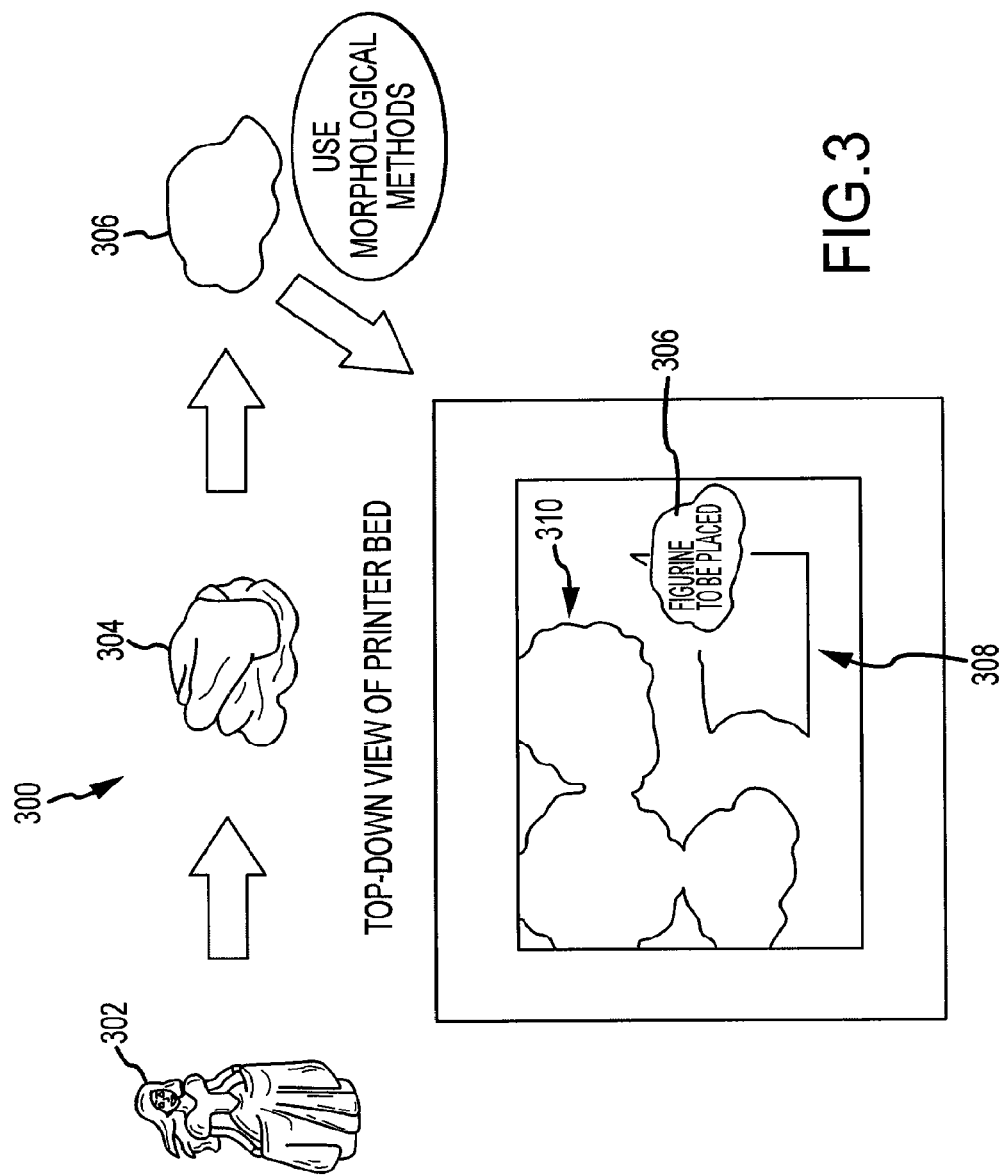
FIG. 3 illustrates steps in a morphological technique for placing objects within a defined space.

Turing to FIG. 3, the morphological fitting process 300 is illustrated with respect to a figurine 302 (e.g., the irregularly shaped objects). Initially, an image 304 of the figurine is captured, for example by a digital camera. In some examples, a top-down view image of the figurine 302 may be taken. It should be appreciated, however that multiple and/or different angle images of irregular shapes may be captured and utilized in the morphological fitting process to take advantage of 3-D space within a print bed. The top down view is illustrated in this example for the sake of simplicity.

In another embodiment, a point cloud of 3-D points representing a 3-D model may be flattened into a single plane. The 3-D point cloud may be made up of the same points used by the 3-D printer to form the figurine. The flattened points are used to determine a bounding shape through a processing algorithm. Various different techniques may be implemented to determine the bounding shape. For example, the x-shaped method or convex hull method may be used. The bounding shape is then used in the subsequent steps.

Once the image is captured, a binary representation 306 of the image is created. The binary representation 306 may generally appear as a silhouette of the figurine 302 and thus defines an outer perimeter of the figurine for the view/angle at which the image was captured. The binary representation may then be fitted within the defined space (e.g., print bed) with other items 310. In the fitting process, an outline 308 of the useable space may be generated or otherwise determined. The binary representation 306 may be fitted anywhere within the outline 308. As may be appreciated, the queue may include multiple different and/or unique figurines to be printed and thus the outline 308 for a given configuration may be unique. It should further be appreciated that an image for a particular item may serve as a template for all other similar items. For example, if two figurines having the same shape but different sizes are to be printed, a single image may be captured and subsequently scaled to accommodate the respective size differences of the items to be printed.

Conventional systematic placement methods were generally only concerned with regular polygons. However, the present methods allow for both regular polygons and irregular and complex shaped items. Further, in the present methods, morphological techniques define the available space inside a given volume and the morphological techniques place the object within the available space.

Figure 4:
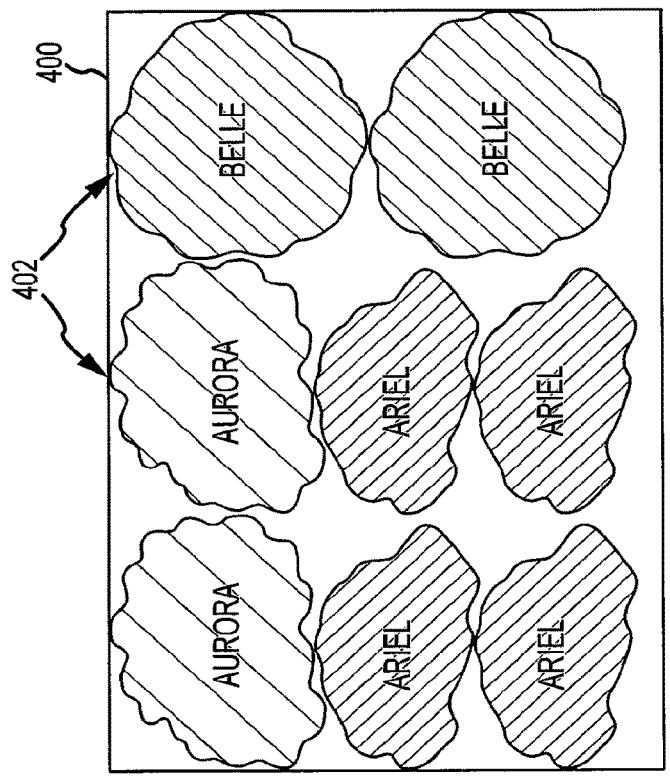
FIG. 4 illustrates an example of an efficiently packed print bin.

FIG. 4 illustrates a print bed configuration 400 that has been filled with a set of irregularly shaped items 402 to be printed. As may be appreciated, the morphological techniques may provide for a densely packed print bed. It should be appreciated that the morphological techniques may be implemented with a variety of different objectives and/or parameters guiding the process. For example, in some examples, one or more of the irregularly shaped objects may have a boundary or threshold distance to be separated from other objects. Additionally, in some examples, the objective may be a threshold number of irregularly shaped items or a threshold number of a particular item with other items rather than the objective of high density. Accordingly, objects are placed systematically while obeying placement constraints such as orientation and spacing between figurines.

Figure 5:
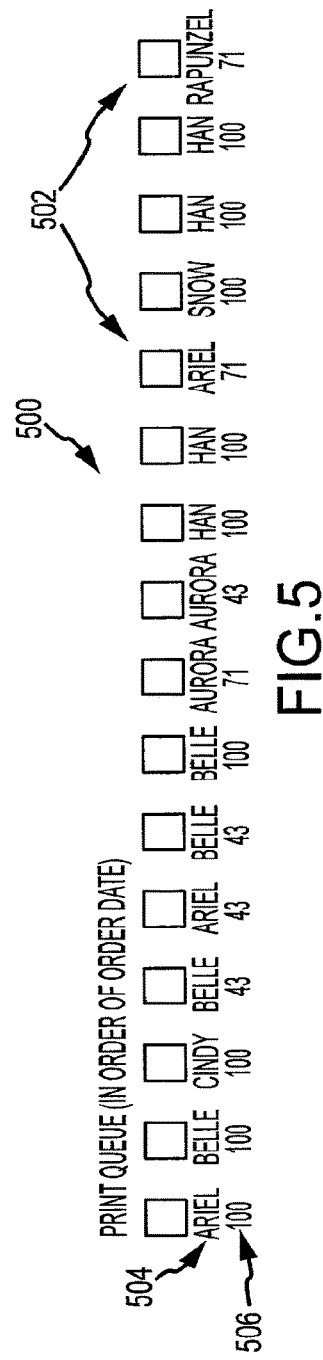
FIG. 5 illustrates an example print queue.

As previously discussed, the morphological techniques may take items from the queue to fill the print bed or defined space. FIG. 5 illustrates an example queue 500. Items 502 within the queue 500 may generally have an organization or order. In one example, the items 502 may be in order based on when they entered the queue 500. For example, the item that has been in the queue 500 the longest may be at the front or top of the queue 500, with all other items ordered chronologically after the first item. Each item in the queue 500 may have characteristics associated with the item. For example, each item may indicate a particular shape of the item, a size of the item, a color or colors of the item, and so forth. Some of the characteristics may be used in the determination of print bed layout.

In FIG. 5, each item 502 has a name 504 which correlates with a particular shape of the item to be printed. Specifically, the names may correlate with a particular princess or character. Additionally, size information 506 is provided. Specifically, the size is scaled with 100 being a largest size the figurine is available in or the figurines full size and numbers other than 100 represent a percentage of full size for the particular item.

FIG. 6 illustrates some general considerations that are taken into account when determining which items from the queue 500 to print. Specifically, how long an item has been in queue (e.g., how long a guest has been waiting for the item) (Block 600). Whether an item is part of a larger order and the number of print bins that the order may occupy (Block 602). Whether there are other items that may be efficiently printed. For example, whether there may be a small batch (e.g., items 43 percent of full size) which would allow for a quick printing process (Block 604).

FIG. 7 illustrates some factors that are based on the aforementioned consideration that may be utilized to obtain a score for particular print bed layouts. A first factor may be a shipment delay penalty factor (Block 700). Generally, this factor is based on the first-in, first-out principle and deviation from that principle incurs a penalty. This factor may be appropriate when there are customer satisfaction concerns that may be avoided based on timely delivery of an item. For example, in some embodiments, at the time an item enters the queue the system may generally be able to provide an indication of how long it will take for the item to print based on the existing queue and items in the queue in front of the newly added item. As such, a customer may be provided with a time estimate for when the item will be ready. Incurring a penalty for deviation from the order of the queue therefore may help to ensure that items that have been in the queue the longest have an advantage over those items recently added to the queue, or rather that the recently added items are disadvantaged due to the incurring of the penalty if the older items are passed over. As shown in FIG. 7, the shipment delay penalty may be significant especially for the first several items in the queue, whereas more recently added items do not incur a significant penalty.

Another factor is the bin-occupancy factor (Block 702). Generally, bin occupancy is not a direct factor but would cause a packing to score poorly due to the amount of time it would take to print a given queue that could be printed faster with a more efficient packing. The bin-occupancy factor is related to how many items fit within a particular bin for a particular layout. If a particular layout does not meet or exceed a certain threshold number of items, it may be penalized as it leaves too many items un-printed. The number of items that fit in a bin may be due in part to at least the shape of the particular item and its size. That is, if the item has a particularly wide shape it may limit the number of other items that may fit within the bin with it. Additionally, if the item is large, such as full size, its size will limit the number of other items that may fit within the bin. Generally, layouts having more items result in a better evaluation of the bin-occupancy factor. Yet another factor is the batch height cost (Block 704). The batch height cost may be set as a cost for printing a particular batch due to the height of the batch. Generally, the taller or higher the items to be printed are, the longer they take to print. An alternative to the batch height cost factor may be a size or speed bonus for batches that include smaller items and which will take less time to print.

As such, there are penalties or costs associated with both the items that remain in the queue (e.g., the shipment delay penalty and bin occupancy penalty) as well as the items that are printed (e.g., the batch height costs). The factors may be utilized alone or in combination to determine a score for particular bin layouts for a particular set of items in the queue. In one example, the costs may be summed to give a particular configuration a score. It should be appreciated that a single configuration may receive different scores at different times based on what items are included in the queue.

Figure 8:
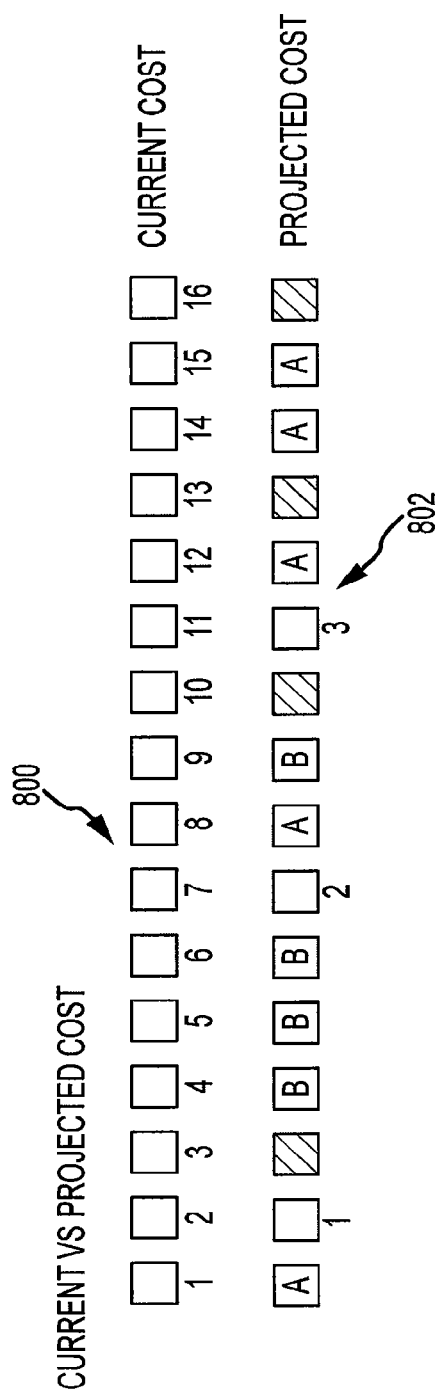
FIG. 8 illustrates a current cost queue and a projected cost queue.

FIG. 8 illustrates queues for current cost and projected costs. The current costs include all of the items in the queue as shown in the top queue 800. The bottom queue 802 shows projected costs as including only costs remaining in the queue. Specifically, items that have been printed A and B, as well as those currently selected for printing in gray are not considered for projected cost purposes. The items remaining in the queue are given a projected rank in queue (e.g., 1, 2, 3, etc.) The rank in the queue is used to compute projected ship date, which affects both shipment-delay penalty and bin-occupancy penalty.

Figure 9:
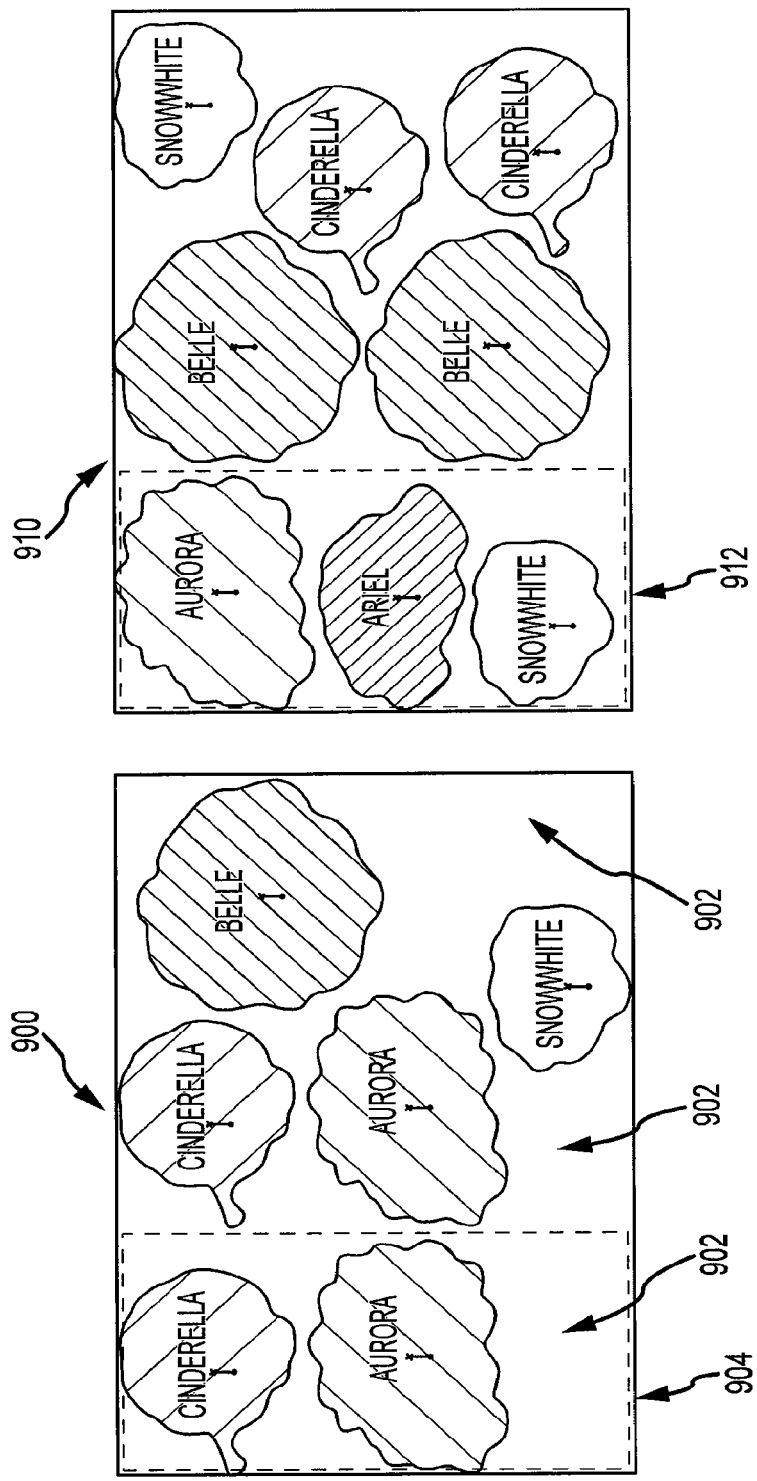
FIG. 9 illustrates a first inefficiently packed print bin and a second efficiently packed print bin.

The use of the foregoing techniques allows for selection of print bed layouts that achieve efficient packing of irregularly shaped items. As part of the selection process, layouts are evaluated and scored. The layouts may be modified using morphological techniques to better pack items within the print beds. FIG. 9 illustrates two print beds for comparison. The first print bed includes several areas 900 where there are no items. In particular, in a left-side of the print bed a region 902 includes only 2 items and leaves a large amount of space unused. In contrast, the second print bed layout 910 efficiently utilizes its space. The left-side 912 of the print bed in particular is filled with three items and there is little unused space. As such, in examples where high density packing is an optimization goal, the second print bed may generally be preferred. However, the first print bed may be modified to include certain subsets of configurations of the second bed. Specifically, the left-side of the first print bed may be replaced with the layout of the left-side of the second print bed to better utilize the space of the first bed.

In some examples, the 3-D shape of the object may be considered for placement within a defined space. That is, rather than relying on a single dimension (e.g., the top view silhouette) of the item to be placed in the defined space, all dimensions of the object may be considered. For example multiple different images of the object may be taken at different angles and viewpoints. The entire shape of the item and other items may therefore be considered for positioning within the defined space. In particular, in some examples, some figurines may have a generally conical or pyramidal shape with their head being a blunted point of the cone or pyramid. As such, it may be advantageous to insert some figurines in an inverted manner within the space to more densely pack the space.

Generally, the techniques include setting of optimization parameters are initially set and then sought after through the iterative process. However, it should be appreciated that there may be physical limitations and/or equipment limitations that may constrain convergence to the optimization. For example, the rotational freedom of the objects may be limited as there may be certain penalties incurred such as degradation in quality if the objects are rotated beyond a certain point. Other limitations may be hard limitations that may not be breached.

The system and methods described automatically obey system constraints while placing objects into the defined space. This decreases the time required to define the printing arrangement. Further, the system seeks to find available space that traditionally may be overlooked be human operator system. Through careful configuration generation, the techniques described herein may generate a configuration that surpasses what the human operator achieves. Specifically, using a well-defined cost function with the genetic algorithm, the computer is able to track which sub-assemblies lead to good packing configuration. The computer also offers the capability to test many more possible combinations than a human operator in a short amount of time, thus leading to increased likelihood of finding near-optimum solutions. Another advantage of this design is that a computer can quickly evaluate a complex cost function for a given queue across thousands of packing configurations, whereas a human operator may only be able to account for small number of criteria across a small number of configurations. Further, the use of morphological methods in the placement of items within the defined space allows regular and complex shaped objects to be placed and packed in the space. This reduces the amount of wasted space because objects are placed based on the individual profiles and not a bounding box that conforms to regular shape placement.

Although the foregoing discussion has presented specific examples, persons skilled in the art will recognize that changes may be made in form and detail without departing from the spirit and scope of the examples. Accordingly, the specific examples described herein should be understood as examples and not limiting the scope thereof. For example, some examples may utilize a brute force methodology to determine all of the various layouts possible and then select a best option for items in the queue. In other examples, future targeting may be implemented to help optimize packing based on future demand. Additionally, in some examples different algorithms may be implemented to achieve the same or similar results. For example, stochastic algorithms, simulated annealing, Monte Carlo, branch and bound, tree search, and other such algorithms may be implemented instead of or in addition to those discussed above.

We claim:

1. A method comprising:
   predetermining two or more layouts for a defined space of a print bed of a three dimensional printer, each layout of the two or more layouts comprising a plurality of shapes;
   receiving a set comprising data representing physical properties of a plurality of items, wherein the set is stored in a computer readable medium;
   determining two or more configurations of items with at least one configuration for each layout, each configuration of items formed by assigning items from the plurality of items to a plurality of shapes of a layout, wherein one item is assigned to one shape and two or more differently shaped items correspond to the layout shape;
   scoring, by a processor, the two or more configurations of items;
   selecting one of the two or more configurations of items based at least in part upon the scoring; and
   printing by the three dimensional printer the items of the selected configuration of items, wherein the items are arranged in the print bed based on the selected configuration of items.

2. The method of claim 1, wherein the two or more layouts are predetermined using a morphological technique.

3. The method of claim 1 further comprising:
   receiving user input, the user input including at least one layout; and
   including the at least one layout with the predetermined two or more layouts.

4. The method of claim 1, wherein the set comprises one of a queue, a linear queue, a priority queue or a bag.

5. The method of claim 1, wherein the defined space comprises one of a two-dimensional space or a three-dimensional space.

6. The method of claim 1, wherein scoring the two or more configurations of items comprises at least one of:
   determining a height cost for the two or more configurations of items;
   computing an occupancy cost for items in the set not included in the two or more configurations of items; and
   computing a shipment delay cost for items in the set not included in the two or more configurations of items.

7. The method of claim 1, wherein scoring the two or more configurations of items comprises summing a height cost, a bin-occupancy cost, and a shipment delay cost for the two or more configurations of items.

8. The method of claim 1, wherein each configuration of items comprises a subset of the set of the items, each item of each subset having an orientation and a position within the configuration of items.

9. The method of claim 1 wherein scoring further comprises:
   updating the set upon selection of a configuration of items by removing from the set items included in the configuration of items; and
   evaluating the updated set after removal of the items.

10. The method of claim 1 wherein the two or more configurations of items are generated using the set, wherein the set comprises one of a linear queue, a priority queue or a bag.

11. The method of claim 10 wherein the set is organized by at least one of a dollar value and fabrication priority.

12. The method of claim 10 wherein the two or more configurations of items are formed by greedily pulling items from the set.

13. The method of claim 2 wherein the morphological technique comprises successively placing layout shapes in the defined space while maintaining one or more system constraints defining placement of the layout shapes.

14. The method of claim 2 wherein the morphological technique comprises moving the layout shapes in the defined space in round-robin fashion.

15. The method of claim 13, wherein the system of constraints includes at least one of: a minimum distance between the layout shapes, orientation of the layout shapes relative to the defined space, and orientation of the layout shapes relative to one another.

16. The method of claim 1, wherein predetermining the two or more layouts comprises utilizing a genetic technique.

17. The method of claim 1, wherein predetermining the two or more layouts comprises utilizing both a genetic technique and a morphological method.

18. The method of claim 1, wherein predetermining the two or more layouts further comprises:
selecting a portion of a first layout for subsequent use; and
implementing the portion of the first layout in a second layout.

19. A method comprising:
pre-computing at least two layouts using a morphological technique, each layout comprising a plurality of holes positioned within a defined space of a three dimensional printer;
receiving a queue comprising data representing physical properties of a plurality of irregularly shaped items, the queue stored in a computer readable medium, wherein two or more of the irregularly shaped items correspond to at least one of the plurality of holes;
iteratively determining a plurality of configurations fitting a subset of the queue into the defined space wherein the plurality of configurations comprises a different subset of the queue of irregularly shaped items and wherein there is at least one configuration for each layout;
scoring the plurality of configurations;
selecting one of the plurality of configurations based at least in part upon the scoring of the plurality of configurations; and
printing by the three dimensional printer the items of the selected configuration, wherein the items are arranged in the three dimensional printer based on, the selected configuration.

20. The method of claim 19 further comprising
implementing a heuristic technique to maintain selected configurations in the computer readable medium.

21. The method of claim 19 further comprising:
receiving user input corresponding to at least one layout; and
storing the user input with the pre-computed at least two layouts for use in determining the plurality of configurations.

22. A system comprising:
a computer storage device configured to store a set comprising data representing physical properties of a plurality of irregularly shaped items to be printed;
a processor in communication with the computer storage device, the processor configured to:
predetermine two or more layouts for a defined space, each layout comprising a plurality of shapes;
receive the set;
determine two or more configurations with at least one configuration for each layout, each configuration of items formed by assigning a items from the plurality of items to a plurality of shapes of a layout, wherein one item is assigned to one shape and two or more differently shaped items correspond to the layout shape;
score the two or more configurations;
select one configuration of the two or more configurations based at least in part upon the scoring; and
output instructions for printing in a three dimensional print bed the selected configuration, the three dimensional print bed corresponding to the defined space; and
a three dimensional printer in communication with the processor, wherein the three dimensional printer prints items corresponding to the selected configuration.

23. The system of claim 22, wherein the selected configuration corresponds to a defined space of a container for packing a subset of the plurality of items in the set.

* * * * *